United States Patent
Altieri-Weimar et al.

(10) Patent No.: US 11,450,794 B2
(45) Date of Patent: *Sep. 20, 2022

(54) CARRIER AND COMPONENT WITH A BUFFER LAYER, AND METHOD FOR PRODUCING A COMPONENT

(71) Applicant: OSRAM OLED GmbH, Regensburg (DE)

(72) Inventors: Paola Altieri-Weimar, Regensburg (DE); Ingo Neudecker, Neutraubling (DE); Michael Zitzlsperger, Regensburg (DE); Stefan Groetsch, Bad Abbach (DE); Holger Klassen, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 125 days.

This patent is subject to a terminal disclaimer.

(21) Appl. No.: 16/639,722

(22) PCT Filed: Jul. 23, 2018

(86) PCT No.: PCT/EP2018/069910
§ 371 (c)(1),
(2) Date: Feb. 17, 2020

(87) PCT Pub. No.: WO2019/037997
PCT Pub. Date: Feb. 28, 2019

(65) Prior Publication Data
US 2020/0235271 A1    Jul. 23, 2020

(30) Foreign Application Priority Data
Aug. 24, 2017 (DE) .......................... 102017119344.8

(51) Int. Cl.
*H01L 33/62* (2010.01)
*H01L 33/00* (2010.01)
*H01L 33/38* (2010.01)

(52) U.S. Cl.
CPC ............ *H01L 33/62* (2013.01); *H01L 33/005* (2013.01); *H01L 33/382* (2013.01); *H01L 2933/0033* (2013.01); *H01L 2933/0066* (2013.01)

(58) Field of Classification Search
CPC combination set(s) only.
See application file for complete search history.

(56) References Cited

U.S. PATENT DOCUMENTS 4,886,709 A    12/1989  Sasame et al.
5,654,586 A *   8/1997  Schwarzbauer .... H01L 23/3735
                                                         257/700
(Continued)

FOREIGN PATENT DOCUMENTS

DE    3888880 T2    7/1994
DE    4315272 A1   11/1994
(Continued)

*Primary Examiner* — Ratisha Mehta
(74) *Attorney, Agent, or Firm* — Slater Matsil, LLP

(57) ABSTRACT

A carrier and a component are disclosed. In an embodiment a component includes a semiconductor chip including a substrate and a semiconductor body arranged thereon and a metallic carrier having a coefficient of thermal expansion which is at least 1.5 times greater than a coefficient of thermal expansion of the substrate or of the semiconductor chip, wherein the semiconductor chip is attached to a mounting surface of the metallic carrier by a connection layer such that the connection layer is located between the semiconductor chip and a buffer layer and adjoins a rear side of the semiconductor chip, wherein the buffer layer has a yield stress which is at least 10 MPa and at most 300 MPa, (Continued)

and wherein the substrate of the semiconductor chip and the metallic carrier of the component have a higher yield stress than the buffer layer.

19 Claims, 11 Drawing Sheets

(56) References Cited

U.S. PATENT DOCUMENTS

| | | | |
|---|---|---|---|
| 8,796,714 B2 | 8/2014 | Grolier et al. | |
| 8,835,937 B2 | 9/2014 | Wirth et al. | |
| 9,385,259 B2 | 7/2016 | Hahn et al. | |
| 10,475,778 B2 | 11/2019 | Pfeuffer et al. | |
| 2002/0100545 A1* | 8/2002 | Gross | H01L 24/83 156/278 |
| 2009/0190320 A1* | 7/2009 | Shimizu | H01L 24/73 361/809 |
| 2011/0198609 A1 | 8/2011 | Huang | |
| 2011/0223747 A1* | 9/2011 | Scholz | H01L 21/02532 438/482 |
| 2012/0313131 A1 | 12/2012 | Oda et al. | |
| 2013/0044322 A1* | 2/2013 | Feitisch | H01S 5/068 356/432 |
| 2016/0172546 A1* | 6/2016 | Moosburger | H01L 33/62 257/98 |
| 2017/0236775 A1 | 8/2017 | Hishiki et al. | |
| 2017/0352776 A1* | 12/2017 | Shur | H01L 33/12 |
| 2018/0094799 A1* | 4/2018 | Shan | H01L 25/0753 |
| 2019/0131208 A1* | 5/2019 | Feichtinger | H01L 33/62 |
| 2020/0075529 A1* | 3/2020 | Otsuka | H01L 23/3735 |

FOREIGN PATENT DOCUMENTS

| | | |
|---|---|---|
| DE | 102005007601 A1 | 9/2005 |
| DE | 102005051811 A1 | 5/2007 |
| DE | 102008046724 A1 | 4/2009 |
| DE | 102009019161 A1 | 11/2010 |
| DE | 102011086546 A1 | 5/2013 |
| DE | 102011056087 A1 | 6/2013 |
| DE | 102015108545 A1 | 12/2016 |

* cited by examiner

FIG 6A

| FIG | T | D3 | N |
|---|---|---|---|
| FIG 1A | T1 | 2 μm | 163 MPa |
| FIG 3B | T1 | 2 μm | 138 MPa |
| FIG 3B | T1 | 10 μm | 126 MPa |
| FIG 3C | T1 | 2 μm | 123 MPa |

FIG 6B

| FIG | T | K | N |
|---|---|---|---|
| FIG 1A | T1 | 3.5 μm | 128 MPa |
| FIG 3B | T2 | 2.8 μm | 83 MPa |

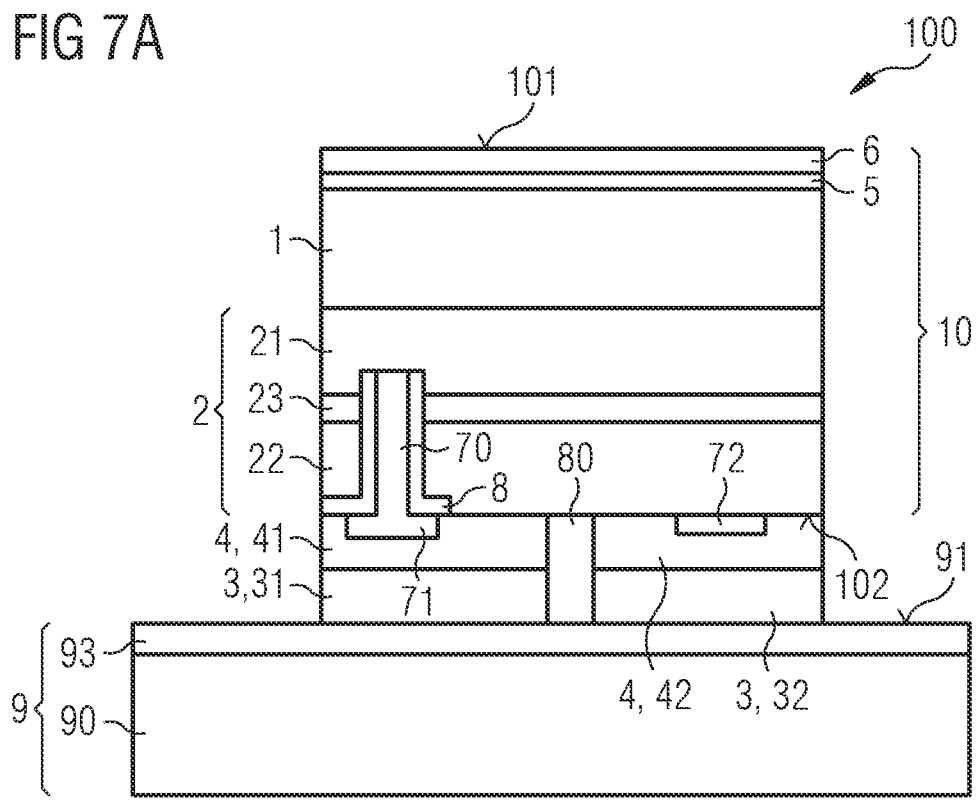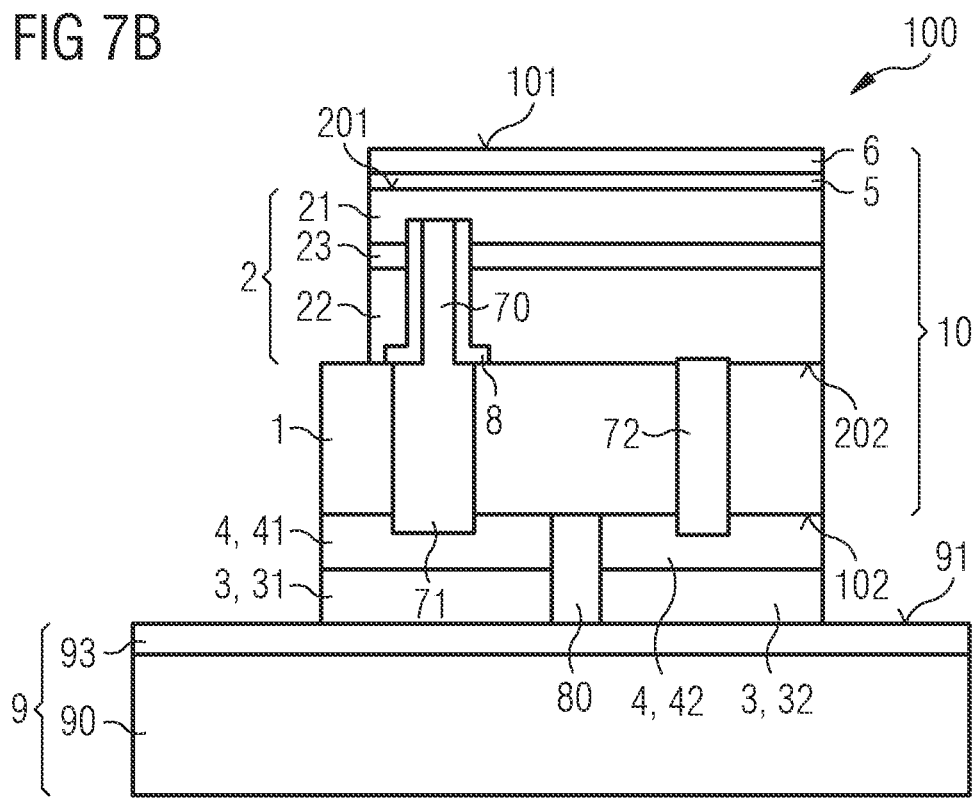

CARRIER AND COMPONENT WITH A BUFFER LAYER, AND METHOD FOR PRODUCING A COMPONENT

This patent application is a national phase filing under section 371 of PCT/EP2018/069910, filed Jul. 23, 2018, which claims the priority of German patent application 102017119344.8, filed Aug. 24, 2017, each of which is incorporated herein by reference in its entirety.

TECHNICAL FIELD

A carrier in particular for optoelectronic components is specified. In addition, a component, especially an optoelectronic component, having high mechanical stability is specified. Furthermore, a method for producing a component is specified.

BACKGROUND

In the case of a component comprising a semiconductor chip which is attached to a metallic carrier by a connection layer, on the carrier side and on the semiconductor chip side internal thermo-mechanical tensions often occur in the event of temperature fluctuations due to different thermal expansion coefficients. The internal tensions can lead to damage, in particular to undesirable deformations of the component or of the semiconductor chip or of the carrier, as a result of which the deformations can cause mechanical fractures in the component or severe bend and finally delamination of the semiconductor chip from the carrier.

SUMMARY OF THE INVENTION

Embodiments provide a temperature stable carrier and a component having increased mechanical stability. Further embodiments provide a simplified and efficient method for producing a mechanically and thermally stable component.

According to at least one embodiment of a carrier, it has a buffer layer and a base body. The buffer layer is arranged in particular on the base body. In particular, the carrier is formed to be metallic. A metallic carrier is generally understood to mean a carrier whose metal content is at least 50, 60, 70, 80, 90 or at least 95% of the total weight and/or volume of the carrier. For example, the base body is formed from or consists of a first metal. The buffer layer may be formed from or consist of a second metal. In particular, the first metal differs from the second metal, for example with respect to yield stress.

According to at least one embodiment of the carrier, it is a printed circuit board. The base body of the carrier can form a metallic core, for example a lead frame or several lead frames of the circuit board. In addition to the base body, the carrier can have a mold body, in particular an electrically insulating mold body, which in particular encloses the base body. The carrier can have conductor tracks which are arranged for instance on the mounting surface. For example, the carrier is formed for mounting and/or for the electrical contacting of one or a plurality of semiconductor chips.

According to at least one embodiment of the carrier, it has a first main surface. The first main surface may be an exposed front side of the carrier. For example, the first main surface is a surface of the buffer layer, a metallization layer or of a connection layer. The carrier may have a second main surface, which may be an exposed rear side of the carrier. In particular, the carrier has a mounting surface configured for receiving a component, such as a semiconductor chip. For example, the buffer layer is located between the mounting surface and the base body. The mounting surface may be a subsection of the first main surface or the entire first main surface.

According to at least one embodiment of the carrier, the buffer layer has a yield stress which is at least 10 MPa and at most 300 MPa. The base body and the buffer layer can be formed with regard to their material selection in such a way that a yield stress of the base body is greater than the yield stress of the buffer layer.

The yield stress of a layer is generally understood to be the normal stress required to initiate and uphold plastic flow under uniaxial stress conditions of the layer concerned. The yield stress of a layer can also generally be understood as the average yield stress of this layer. The yield stress is mainly dependent on the material, the size of deformation, the strain rate or deformation rate and the forming temperature. The values for yield stress for known materials determined under normal standard conditions can be taken from the standard books. In case of doubt, the values for yield stress can be determined at a deformation which is 0.2% higher than the linear elastic deformation and at a total strain rate between 10-6/s and 10-2/s inclusive or between $10^{-6}$/s and $10^{-4}$/s, for instance at $5*10^{-4}$/s or at $10^{-5}$/s, and at forming temperatures between –50° C. and 280° C. inclusive, for example at a forming temperature of 20° C. or 75° C.

In at least one embodiment of the carrier comprising a buffer layer and a base body, the carrier has a mounting surface for receiving a semiconductor chip, wherein the buffer layer is located between the mounting surface and the base body. The buffer layer has a yield stress between 10 MPa and 300 MPa inclusive. The carrier is metallic. Preferably, the base body is formed from a first metal, wherein the buffer layer is formed from a second metal different from the first metal. The base body and the buffer layer are formed with respect to the material composition in such a way that a yield stress of the base body is greater than the yield stress of the buffer layer.

Due to the presence of the buffer layer, a deformation of the carrier, in particular of the base body, for example in the form of bending at fluctuating operating temperatures, can be minimized. Using the buffer layer, the semiconductor chip can be reliably fixed the on the carrier, for instance by soldering, for forming a stable component, since the internal mechanical tensions, which occur after soldering and during the cooling phase of the component, can be absorbed to a large extent by the buffer layer. The risk of cracks forming within the connection layer and/or within the carrier is also reduced.

According to at least one embodiment of the carrier, it has a metallization layer, which is in particular a galvanic metallization layer. In particular, the metallization layer adjoins the buffer layer. For example, the metallization layer is arranged vertically between the base body of the carrier and the buffer layer. It is also possible that the buffer layer is located between the base body of the carrier and the metallization layer. The first main surface and/or the mounting surface of the carrier can be formed by a surface, in particular by an at least partially exposed surface of the metallization. Alternatively, it is possible that the first main surface and/or the mounting surface of the carrier are/is formed by a surface of the buffer layer or of a connection layer arranged on the base body.

According to at least one embodiment of a component, it comprises a semiconductor chip, a connection layer and a carrier. In particular, the semiconductor chip is attached to the carrier by the connection layer, which is for instance a solder layer. The carrier described here is particularly suitable for forming a component described here. The features described in connection with the carrier can therefore also be used for the component, and vice versa.

According to at least one embodiment of the component, the semiconductor chip comprises a substrate and a semiconductor body arranged on the substrate. In particular, the semiconductor body has a diode structure. For example, the semiconductor body comprises an optically active zone, in particular a pn-junction zone. During operation of the semiconductor chip, the optically active zone is in particular configured to emit or detect electromagnetic radiation in the visible, ultraviolet or infrared spectral range. For example, the semiconductor chip is a light-emitting diode (LED), such as a light-emitting high-power diode, or a photodiode.

The substrate can be a growth substrate on which the semiconductor body is epitaxially grown. It is also possible that the substrate is different from a growth substrate. The semiconductor chip can be free of a growth substrate. The substrate on which the semiconductor body is arranged can have a base body that is electrically insulating. The substrate may be electrically insulating as a whole.

In particular, the substrate, especially a base body of the substrate, is formed from a material which differs from a metal. For example, the substrate or the base body of the substrate is based on a semiconductor material, such as Si or Ge, or on a ceramic material, such as SiN or SiC. The substrate may also have additional fillers, such as plastic. In particular, the substrate can be formed from a mixture of a ceramic material and/or semiconductor material and one or several plastic materials. It is possible that at least 50, 60, 70, 80, or at least 90% of the weight and/or volume of the semiconductor chip is accounted for by the substrate. Alternatively or additionally, it is possible for the substrate to have one metallic through-contact or more, for instance two metallic through-contacts. In this case, the substrate may have a base body formed from a semiconductor material or from an electrically insulating material. The through-contact or the plurality of through-contacts may extend throughout the base body, for example from a rear side of the substrate to a front side of the substrate.

According to at least one embodiment of the component, it has a metallic carrier. The semiconductor chip having the substrate is arranged on the metallic carrier. The metallic carrier can have a base body made of metal. For example, the metallic carrier is a lead frame or a circuit board having a metal core, such as a metal core board. In particular, the component is mechanically supported mainly by the metallic carrier. In particular, the metallic carrier differs from a general chip carrier which supports the semiconductor body and stabilizes the semiconductor chip. For example, the component may have a plurality of semiconductor chips, which in each case contain a separate substrate and are arranged on a common metallic carrier.

According to at least one embodiment of the component, the connection layer is located between the semiconductor chip and the metallic carrier. Preferably, the connection layer is a solder layer, in particular a solder layer based on AuSn and/or a solder layer containing indium. The semiconductor chip can be fixed to the metallic carrier by the connection layer, for example in such a way that the substrate of the semiconductor chip faces the metallic carrier. In the vertical direction, the substrate is located for instance between the semiconductor body and the carrier of the component. Alternatively, it is possible that the semiconductor chip is fixed on the metallic carrier in such a way that the semiconductor body is located between the substrate and the carrier.

A vertical direction is generally understood to be a direction which is transverse, in particular perpendicular, to a main extension surface of the semiconductor body or of the carrier. The vertical direction is for instance a growth direction of the semiconductor body. A lateral direction, on the other hand, is understood to be a direction running along, in particular parallel to, the main extension surface of the semiconductor body or of the carrier. The vertical direction and the lateral direction are in particular perpendicular to each other.

According to at least one embodiment of the component, the metallic carrier has a coefficient of thermal expansion which is at least 1.5 times, twice, three times, four times, five times or at least ten times as large as a coefficient of thermal expansion of the substrate of the semiconductor chip or of the entire semiconductor chip. In case of doubt, a coefficient of thermal expansion of a layer is understood to be an average coefficient of thermal expansion, such as an average coefficient of linear thermal expansion of this layer, which is determined under normal standard conditions.

According to at least one embodiment of the component, it has a buffer layer. The buffer layer can be located between the semiconductor chip and the carrier. It is possible that the buffer layer is an integral part of the carrier. For example, the buffer layer is integrated in the carrier. Preferably, the buffer layer is located between the base body of the carrier and the connection layer. The buffer layer can adjoin the base body of the carrier and/or the connection layer. In general, two layers adjoin each other, in particular if they are in direct contact or if there is only a single further layer, in particular a connection layer, or a connection structure between them.

In particular, with regard to its material selection and/or geometry, the buffer layer is formed to compensate for or to reduce internal mechanical tensions in the component, such as thermo-mechanical stresses in the connection layer, in the substrate, in the semiconductor chip and/or in the metallic carrier. According to an embodiment of the component or of the carrier, the buffer layer is preferably formed from a ductile material. For example, the buffer layer is a ductile metallic layer or a ductile metal layer which may contain a metal such as gold, aluminum, copper or similar.

According to at least one embodiment of the component and/or of the carrier, the buffer layer has a yield stress of at most 300 MPa. Preferably, the yield stress of the buffer layer is between 10 MPa and 300 MPa inclusive, for instance between 50 MPa and 300 MPa, 100 MPa and 300 MPa, 150 MPa and 300 MPa, 200 MPa and 300 MPa or between 10 MPa and 250 MPa inclusive, 10 MPa and 200 MPa, 10 MPa and 150 MPa, 10 MPa and 100 MPa or between 100 MPa and 200 MPa inclusive.

According to at least one embodiment of the component and/or of the carrier, the buffer layer is coarse-grained. For example, the buffer layer has an average grain size greater than 100 nm, for example between 100 nm and 150 nm, between 100 nm and 200 nm, between 100 nm and 300 nm, or between 100 nm and 1 µm. The coarse particles of the buffer layer can be metals or metal alloys. In particular, the coarse particles may be embedded in a matrix material such as plastic. Depending on how coarse-grained the buffer layer is, its yield point can be adjusted. The more coarse-grained the buffer layer is, the lower its yield stress.

In at least one embodiment form of a component, it has a semiconductor chip, a buffer layer, a connection layer and a metallic carrier. The semiconductor chip comprises a substrate and a semiconductor body arranged thereon. The metallic carrier has a coefficient of thermal expansion which is at least 1.5 times as large as a coefficient of thermal expansion of the substrate or of the semiconductor chip. The buffer layer can be located between the metallic carrier and the semiconductor chip. Preferably, the semiconductor chip is attached to a mounting surface of the metallic carrier by the connection layer in such a way that the connection layer is arranged between the semiconductor chip and the buffer layer. In particular, the connection layer adjoins a rear side, for example the substrate, of the semiconductor chip. Moreover, the buffer layer has a yield stress which is at least 10 MPa and at most 300 MPa.

The presence of the buffer layer can reduce internal tensions in the component which occur due to different thermal expansion coefficients on the carrier side and on the semiconductor chip side at large temperature fluctuations. Deformation of the semiconductor chip and/or of the carrier, for example in the form of bending caused by severe fluctuations of the component's operating temperatures, can thus be minimized. The buffer layer can also be used to reliably fix the semiconductor chip on the carrier, e.g., by soldering it to form a stable component, since internal mechanical tensions occurring after soldering and during the cooling phase of the component can be largely absorbed by the buffer layer. The risk of cracks forming within the connection layer and/or the carrier is thus reduced.

According to at least one embodiment of the component and/or of the carrier, compared to the buffer layer, the substrate and/or the carrier and/or the base body of the carrier has/have a greater vertical layer thickness. In particular, the vertical layer thickness of the substrate and/or of the carrier and/or of the base body of the carrier is at least three times, five times, ten times, twenty times or at least fifty times greater than the vertical layer thickness of the buffer layer.

For example, the buffer layer has a vertical layer thickness between 250 nm and 50 µm inclusive, for instance between 1 µm and 10 µm inclusive, 2 µm and 10 µm, 3 µm and 10 µm, or between 300 nm and 5 µm inclusive, 300 nm and 3 µm, or between 10 µm and 40 µm inclusive, 1 µm and 5 µm, or between 1 µm and 3 µm inclusive.

The substrate, the base body of the carrier and/or the entire metallic carrier, however, may have a vertical thickness of at least 50 µm, for example, between 50 µm and 100 µm inclusive, 50 µm and 150 µm, 50 µm and 200 µm, 50 µm and 300 µm or between 50 µm and 400 µm inclusive. It is also possible for the substrate, the base body of the carrier and/or the entire metallic carrier to have a vertical thickness greater than 400 µm.

The metallic carrier, in particular the base body of the carrier can serve as a heat sink for the semiconductor chip. Thus, the buffer layer with its comparatively small vertical expansion has a low thermal resistance, so that heat generated during operation of the semiconductor chip can be efficiently guided towards the metallic carrier via the buffer layer.

According to at least one embodiment of the component and/or of the carrier, the substrate and/or the base body of the carrier and/or the entire metallic carrier has/have a higher yield stress compared to the buffer layer. For example, the difference is at least 30 MPa, 40 MPa, 50 MPa, 60 MPa or at least 100 MPa. Due to such a design of the component or of the carrier, the onset and the upholding of the plastic flow of the buffer layer is achieved earlier in comparison with the substrate and/or with the base body of the metallic carrier, as a result of which fractures within the component can be avoided, especially in the region of the substrate or of the connection layer. The substrate can be formed from a semiconductor material or from a ceramic material and thus can be more brittle than the buffer layer and the base body of the metallic carrier.

According to at least one embodiment of the component, the substrate has a greater vertical layer thickness and a greater yield stress than the buffer layer. The metallic carrier, in particular the base body of the metallic carrier, can have a greater yield stress and/or a greater vertical layer thickness than the buffer layer.

According to at least one embodiment of the component, in a plan view of the carrier, the buffer layer is covered by the semiconductor chip at least in places. For example, the semiconductor chip completely overlaps with the buffer layer in top view. In other words, in a plan view of the carrier, the semiconductor chip has in particular no subsection that does not overlap with the buffer layer. In at least one or in all lateral directions, the buffer layer can project laterally beyond the semiconductor chip in places. The buffer layer and/or the carrier may have a lateral cross-section which is at least as large as or larger than a maximum lateral cross-section of the semiconductor chip.

According to at least one embodiment of the component and/or of the carrier, the thermal expansion coefficient of the carrier is greater than 8 ppm/K, for example, between 8 ppm/K inclusive and 30 ppm/K. The coefficient of thermal expansion of the substrate or of the semiconductor chip can be less than 15 ppm/K, for example, less than 8 ppm/K, i.e., less than $8*10^{-6}$ $K^{-1}$, for example, between 2 ppm/K and 15 ppm/K inclusive. In particular, the coefficient of thermal expansion of the metallic carrier or of the base body of the carrier differs by at least 3 ppm/K, 5 ppm/K, 7 ppm/K or by at least 10 ppm/K from the coefficient of thermal expansion of the substrate or of the semiconductor chip.

According to at least one embodiment of the component, the substrate or a base body of the substrate of the semiconductor chip is formed from a ceramic material which may be based on SiN or on SiC, or from a semiconductor material such as Si and Ge. Ceramic material has a high thermal conductivity and is particularly suitable as a material for the substrate of a high-power diode. Such a substrate can comprise plastics and/or metallic through-contacts.

According to at least one embodiment of the component and/or of the carrier, the carrier has at least one material from the group consisting of Ag, Al, Au, Cu, Mg, Mn, Ni, Pb, Pt, Sn, Mo, W and Zn.

According to at least one embodiment of the component and/or of the carrier, the buffer layer comprises at least one metal or consists of a metal or a metal alloy. In particular, the buffer layer may be formed from a ductile metal such as Au, Al, Cu or from a similar metal. Preferably, with respect to its material selection and with regard to the carrier and/or the substrate, the buffer layer is formed in such a way that it has a lower yield stress than the carrier and/or the substrate.

According to at least one embodiment of the component and/or the carrier, the connection layer is a solder layer, for example, an AuSn-based solder layer and/or an indium-containing solder layer. The bonding of the semiconductor chip to the carrier is carried out at a temperature above the melting temperature of the solder used. In the case of AuSn, the melting temperature is 280° C. or higher. During the cooling phase, the size of the component is reduced, but not uniformly in the region of the semiconductor chip and in the region of the carrier. It has been shown that the buffer layer made of a metal or metal alloy having a yield stress between 10 MPa and 300 MPa inclusive, in particular between 100

MPa and 300 MPa inclusive, can compensate strong tensions in the component over a wide temperature range between −50° C. and 300° C. inclusive, for example. In this way, possible bending of the semiconductor chip and/or of the carrier or delamination of the semiconductor chip due to temperature fluctuations can be avoided.

According to at least one embodiment of the component, it has a converter layer containing phosphors, i.e., wavelength-converting phosphors. The semiconductor chip is in particular a light-emitting diode. The converter layer can be attached to the semiconductor chip, for example, on a surface of the semiconductor chip facing away from the carrier. For example, the converter layer is arranged on a top side of the semiconductor body facing away from the substrate. If the semiconductor body is situated between the substrate and the carrier, the converter layer may be located on a top side of the substrate facing away from the semiconductor body. In particular, during operation of the component, the converter layer is configured to convert short-wave spectral ranges, in particular blue or ultraviolet spectral ranges of the electromagnetic radiation emitted by the semiconductor chip into long-wave spectral ranges of the electromagnetic radiation, for example, into yellow, green or red spectral ranges.

The converter layer is preferably a prefabricated converter platelet, which can have a constant vertical layer thickness within the manufacturing tolerances. The converter platelet can be self-supporting and, in particular, flat. The converter platelet can be attached to the semiconductor chip via a further connection layer, for example, on the top side of the semiconductor chip, in particular on the top side of the semiconductor body. The further connection layer can be an adhesive or glue layer and is in particular different from a solder layer. With the use of the buffer layer, deformation of the semiconductor chip is prevented or at least reduced, as a result of which mechanical tensions, in particular in the adhesive connection between the converter platelet and the semiconductor chip, and thus also the risk with regard to color location shift, are reduced. In other words, chromaticity shift variations caused by deformation or by bending of the converter layer or of the converter platelet can be avoided or minimized during operation of the component.

The buffer layer prevents or reduces possible distortions or deformations of the component, of the carrier or of the semiconductor chip so that a stable connection between the converter platelet and the semiconductor chip can be ensured. Without the buffer layer, such distortions or deformations would occur frequently, especially if the substrate and/or carrier has/have a vertical layer thickness that is less than 400 µm, especially less than 300 µm or less than 200 µm.

According to at least one embodiment of the component, the buffer layer covers at least 90% of a rear side of the semiconductor chip or of the substrate facing the carrier. For example, the buffer layer completely covers the rear side of the semiconductor chip. In top view, the carrier and/or the buffer layer has a larger surface area than the semiconductor chip, for example. In particular, the buffer layer is not located exclusively in the areas below the semiconductor chip and can protrude laterally over the semiconductor chip on the mounting surface of the carrier. It is possible for the component to have a plurality of semiconductor chips on a common metallic carrier, wherein in each case, a subsection of the buffer layer is assigned uniquely to one of the semiconductor chips or to several semiconductor chips, and vice versa.

According to at least one embodiment of the component, the substrate is located between the carrier and the semiconductor body. Alternatively, it is possible for the semiconductor body to be arranged between the carrier and the substrate.

According to at least one embodiment of the component and/or of the carrier, the buffer layer is structured. For example, the mounting surface is a subsection of the first main surface of the carrier, wherein the buffer layer is formed in a structured manner such that it covers the mounting surface completely and the first main surface only partially. The size of the mounting surface is thus defined by the structuring of the buffer layer. Alternatively, the buffer layer can be continuous and/or free of holes. In particular, in a plan view of the carrier, the buffer layer completely covers the base body of the carrier. In other words, the buffer layer can completely cover a surface of the base body of the carrier facing the buffer layer and/or the first main surface of the carrier.

According to at least one embodiment of the component and/or of the carrier, the buffer layer is structured in such a way that it has one or several openings. The opening may extend along the vertical direction throughout the buffer layer or into the buffer layer. In particular, the opening is located laterally to the side of the mounting surface in the lateral direction. For example, the opening is in the form of a trench or frame that partially or completely surrounds the mounting surface laterally. The buffer layer can be divided into a plurality of subsections by the openings. The subsections can form a plurality of laterally spaced mounting surfaces for the semiconductor chips.

In accordance with at least one embodiment of a method for producing a component, the component is tempered after the semiconductor chip or the plurality of semiconductor chips have been mounted on the carrier. For adjusting the flow properties of the connection layer and/or of the buffer layer, the component can be tempered at temperatures between 125° C. and 200° C. inclusive. The heat treatment can be carried out over a period of a few minutes, for instance between 10 minutes and 50 minutes, or a few hours, for instance between 1 hour and 10 hours. The connection layer is for instance an AuSn-based solder layer whose melting temperature is higher than the temperatures applied during heat treatment.

The heat treatment can reduce internal tensions in the component on the one hand and possible bending of the component on the other hand. It has been shown that the curvature of the component can be additionally reduced by at least 5% up to 40% by heat treatment.

The method described above is particularly suitable for the production of a component described here. Features described in connection with the component or with the carrier can therefore also be used for the method, and vice versa.

BRIEF DESCRIPTION OF THE DRAWINGS

Further advantages, preferred embodiments and further developments of the component, the carrier or the method will become apparent from the exemplary embodiments explained below in conjunction with FIGS. 1 to 8.

FIGS. 5A, 5B, 5C, 5D, 6A and 6B show graphical or tabular representations of results of some experimental measurements and simulations of different components with or without a buffer layer before or after heat treatment;

FIGS. 7A and 7B show schematic diagrams of further exemplary embodiments for a component having a buffer layer, each in sectional view.

Figure 1A:
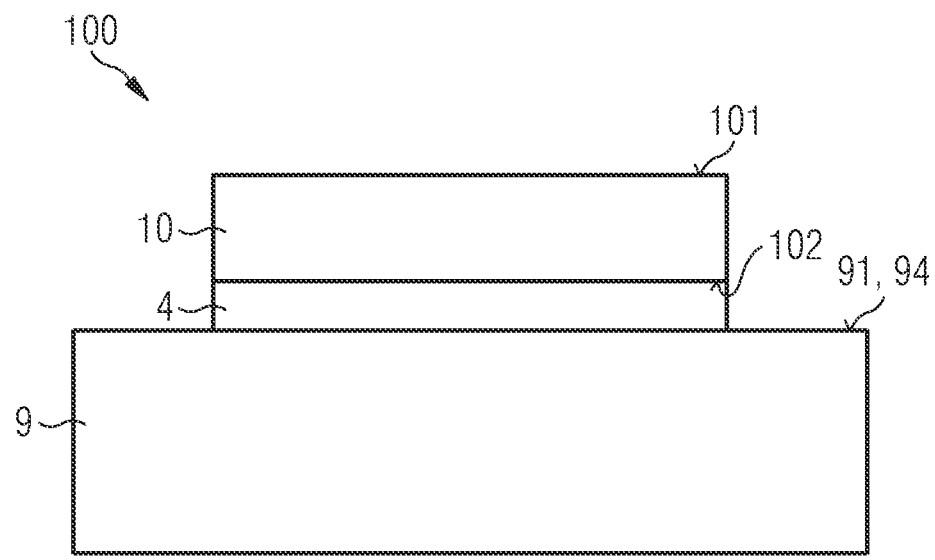
FIG. 1A shows a comparative example of a component without a buffer layer in schematic sectional view.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

FIG. 1A shows a comparative example of a component 100 having a semiconductor chip 10 on a carrier 9, wherein the semiconductor chip 10 is attached to a first main surface 91 or to a mounting surface 94 of the carrier 9 by a connection layer 4.

The semiconductor chip 10 has a front side 101 and a rear side 102 facing away from the front side 101. A front side of component 100 may be formed by the front side 101 of the semiconductor chip 10. For example, the front side 101 is a radiation entrance surface or a radiation exit surface of the semiconductor chip 10 or of the component 100. In particular, the connection layer 4 adjoins both the mounting surface 94 of the carrier 9 and the rear side 102 of the semiconductor chip 10.

Figure 4A:
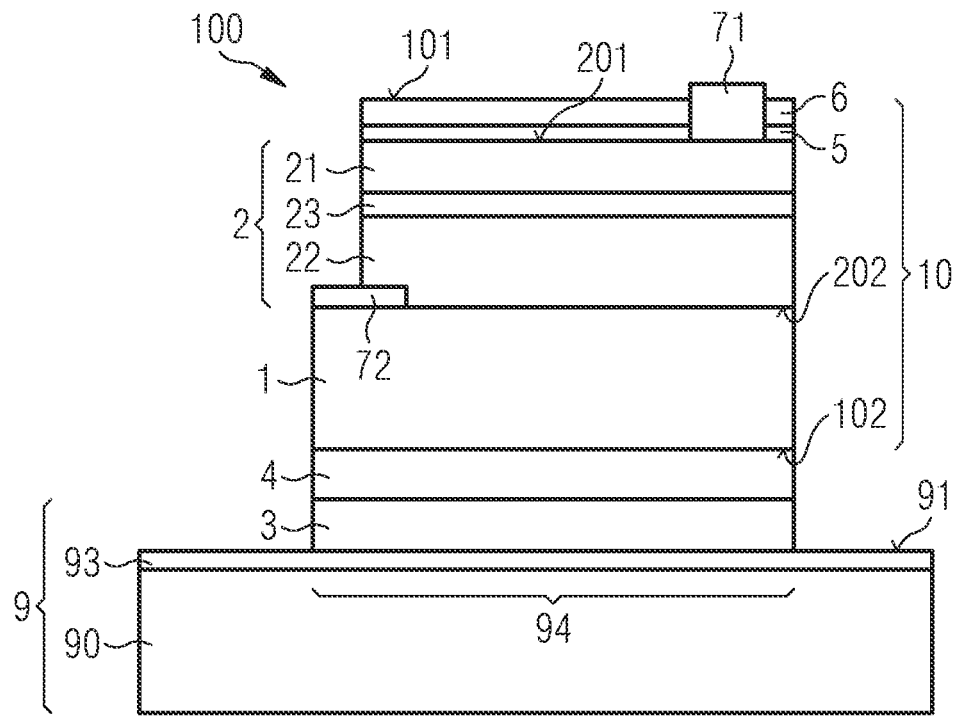
Figure 4B:
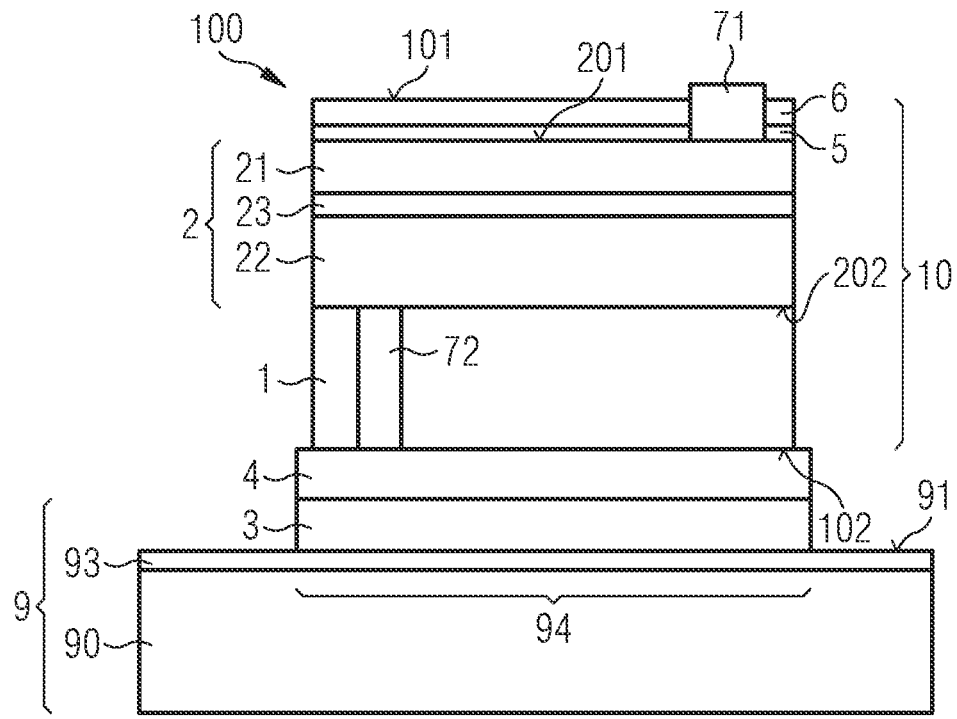
Figure 4C:
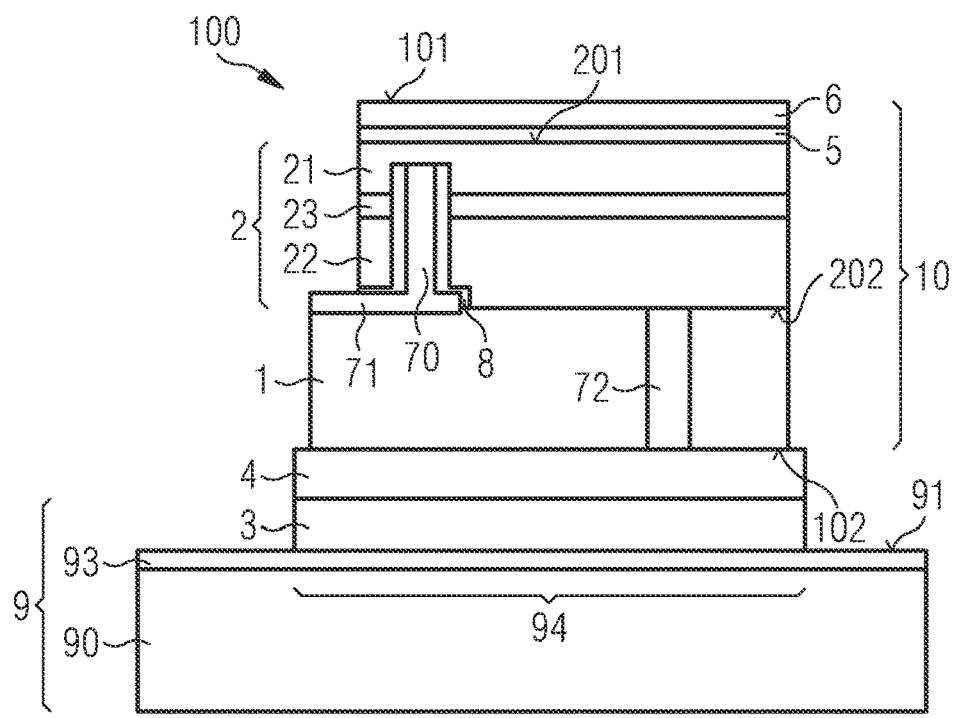

The semiconductor chip 10 comprising a substrate 1, a semiconductor body 2 and optionally a converter layer 6 is shown schematically in FIGS. 4A to 4C, for example.

In general, the carrier 9 and the semiconductor chip 10, especially the carrier 9 and the substrate 1 of the semiconductor chip 10, have different coefficients of thermal expansion. Severe temperature fluctuations can cause internal tensions in the component 100 which lead to bending of the component 100, in particular of the semiconductor chip 10, or to breakage of the component 100 for instance at the connection layer 4. Bending of the semiconductor chip 10, which is in particular an LED having a converter layer 6, can also lead to undesirable changes in the color location when the temperature fluctuates. The converter layer 6, which is for instance in the form of a converter platelet and is attached to the semiconductor chip 10 by means of a further connection layer 5, can be detached from the semiconductor chip 10 due to possible deformation of the component 100.

In order to avoid possible breakages in the connection layer 4 or in the semiconductor chip 10 due to different thermal expansion coefficients between the substrate 1, which is formed for instance from Si, Ge, SiN or SiC, and the carrier 9, which is formed in particular from a metal such as Cu, a sufficient breaking strength of the component 100 should be ensured. This can be achieved, for example, by using a solder connection having high mechanical strength between the semiconductor chip 10 and the carrier 9. In order to prevent strong fluctuations of color location of the semiconductor chip 10 or a detachment of the converter layer 6, a particularly well adhering adhesive should be used for bonding the converter layer 6, and additionally, a minimum thickness should be ensured for a further connection layer 5 which attaches the converter layer 6 to the semiconductor chip 10. Despite the above measures, however, a not negligible quality risk may exist due to the high level of tension in a component 100 having a semiconductor chip 10 on a metallic carrier 9.

To minimize such quality risks, the component 100 can be formed in such a way that that a buffer layer 3 is arranged between the semiconductor chip 10 and the metallic carrier 9, in particular between the semiconductor chip 10 and a base body 90 of the carrier 9. In particular, the buffer layer 3 can be formed as an integral part of the carrier 9.

Figure 1B:
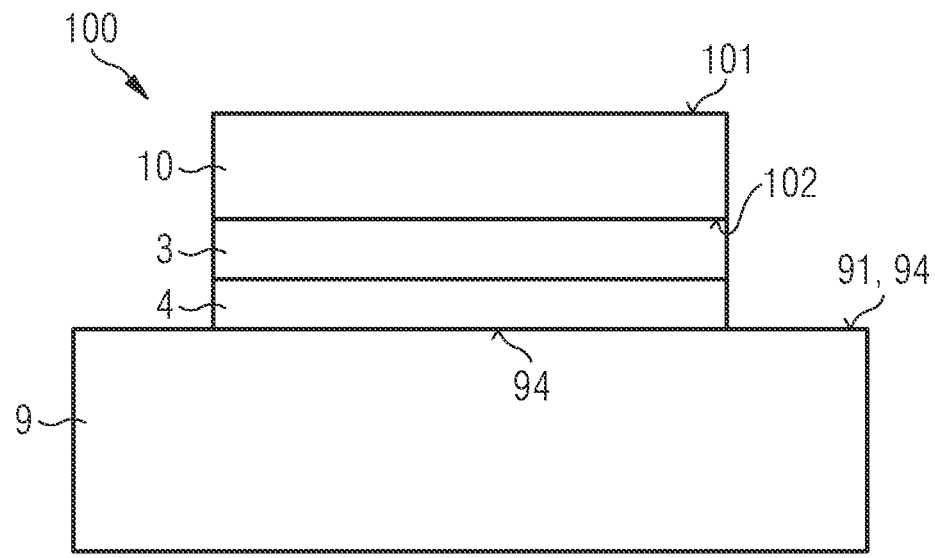
FIG. 1B shows a comparative example of a component having a buffer layer in schematic sectional view.

According to the comparative example shown in FIG. 1B, the component 100 has such a buffer layer 3. The buffer layer 3 is arranged vertically between the semiconductor chip 10 and the connection layer 4. In particular, the buffer layer 3 adjoins both the connection layer 4 and the semiconductor chip 10, especially the substrate 1 of the semiconductor chip 10. Preferably, only the buffer layer 3 and the connection layer 4 are arranged between the mounting surface 94 of the carrier 9 and the rear side 102 of the semiconductor chip 10.

It is possible for the buffer layer 3 to be formed as part of the semiconductor chip 10. In this case, the semiconductor chip 10 already has the buffer layer 3 before the semiconductor chip 10 is mounted on the carrier 9. The buffer layer 3 may be formed directly or indirectly on the semiconductor chip 10, in particular on a rear side 102 of the semiconductor chip 10, for example on the substrate 1 of the semiconductor chip 10. For this purpose, a seed layer can first be formed on the rear side 102, in particular on the substrate 1, whereupon the buffer layer 3 is formed on the seed layer, for example by an electroplating process. Alternatively, it is possible that the buffer layer 3 is formed by another coating process, for example by a vapor deposition or by a deposition process such as vapor phase deposition or by sputtering. In this case, a seed layer can be dispensed with.

In a plan view, the buffer layer 3 can be completely covered by the substrate 1 and/or by the semiconductor body 2. The buffer layer 3 may cover at least 60%, 70%, 90% or at least 95% of a surface of the rear side 102 of the semiconductor chip 10. In at least one lateral direction or in all lateral directions, the buffer layer 3 may be flush with the substrate 1 or with the semiconductor chip 10. If the buffer layer 3 is an integral part of the semiconductor chip 10, it cannot protrude beyond the semiconductor chip 10 along the lateral direction. The expansion of the buffer layer 3 is thus limited for instance by the size of the semiconductor chip 10.

Figure 2A:
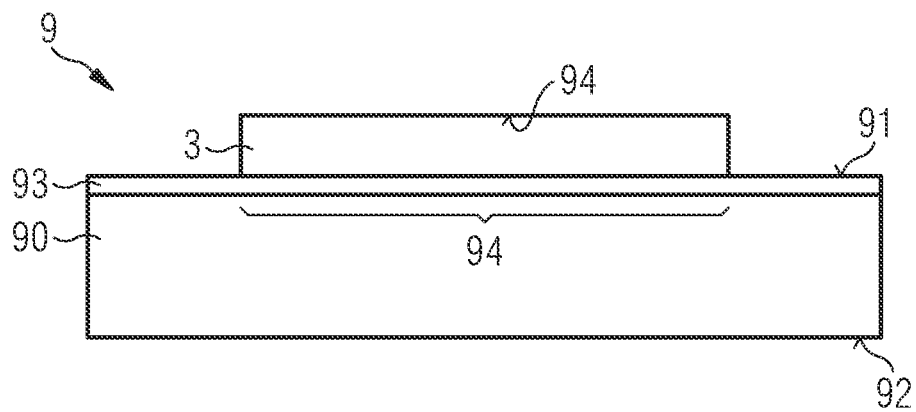
FIGS. 2A, 2B, 2C, 2D, 2E and 2F show schematic diagrams of various exemplary embodiments of a carrier having a buffer layer, each in sectional view.

FIG. 2A shows an exemplary embodiment of a carrier 9, which has a base body 90 and a buffer layer 3 arranged thereon. Between the buffer layer 3 and the base body 90 there is a metallization layer 93, especially an electroplated metallization layer 93. In a plan view, the buffer layer 3 partially covers the base body 90 and/or the metallization layer 93. In particular, the buffer layer 3 forms a socket for accommodating one or a plurality of semiconductor chips 10. The buffer layer 3 can be formed on the base body 90 or on the metallization layer 93 using a mask or by subsequent structuring.

The carrier 9 has a first main surface 91, which is for instance an exposed front side of the carrier 9. For example, the main surface 91 is composed of surfaces of the buffer layer 3 and the metallization layer 93. In particular, a subsection of the main surface 91 is formed as mounting surface 94 of the carrier 9. For example, the mounting surface 94 is formed by a surface of the buffer layer 3. In particular, the mounting face 94 in FIG. 2A is a localized vertical elevation on the main surface 91 of carrier 9. The carrier 9 has a second main surface 92 which is for instance an exposed rear side of the carrier 9. In particular, the second main surface 92 is formed by a surface of the base body 90.

Figure 8:
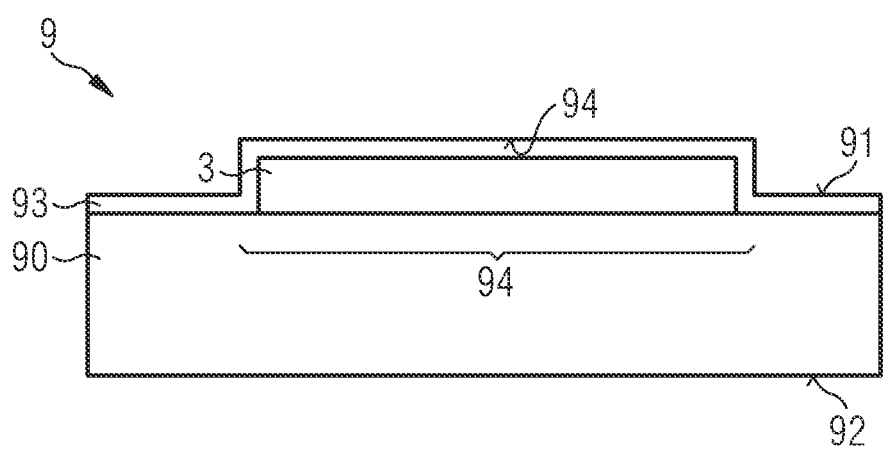
FIG. 8 shows schematic illustration of another exemplary embodiment of a carrier having a buffer layer.

In deviation from FIG. 2A, it is possible that the buffer layer 3 is located between the metallization layer 93 and the base body 90. In particular, the buffer layer 3 is laterally enclosed by the metallization layer 93 (FIG. 8).

Figure 2B:
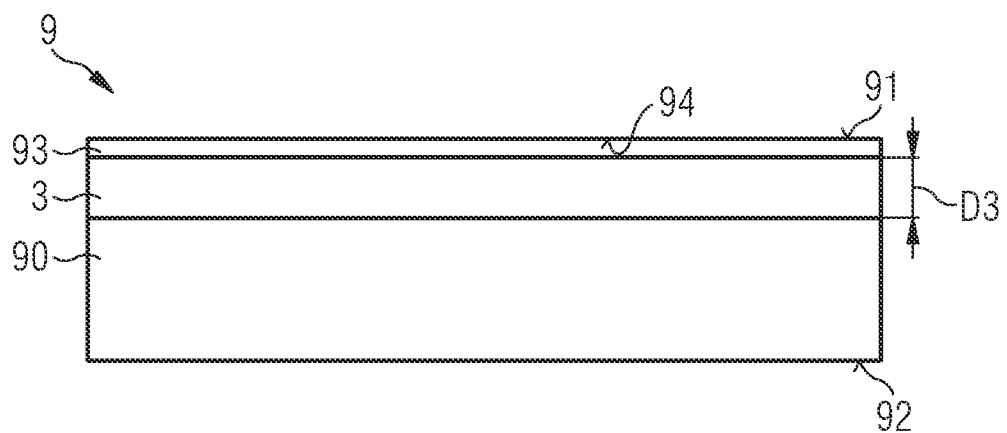

The exemplary embodiment shown in FIG. 2B essentially corresponds to the exemplary embodiment of a carrier 9 shown in FIG. 2A. In contrast, the buffer layer 3 having the vertical layer thickness D3 is arranged between the base body 90 and the metallization layer 93. The buffer layer 3 is continuous and completely covers the base body. In a plan view, the metallization layer 93 can completely cover the buffer layer 3. In particular, the first main surface 91 and/or the mounting surface 94 are/is formed exclusively by a surface of the metallization layer 93.

Figure 2C:
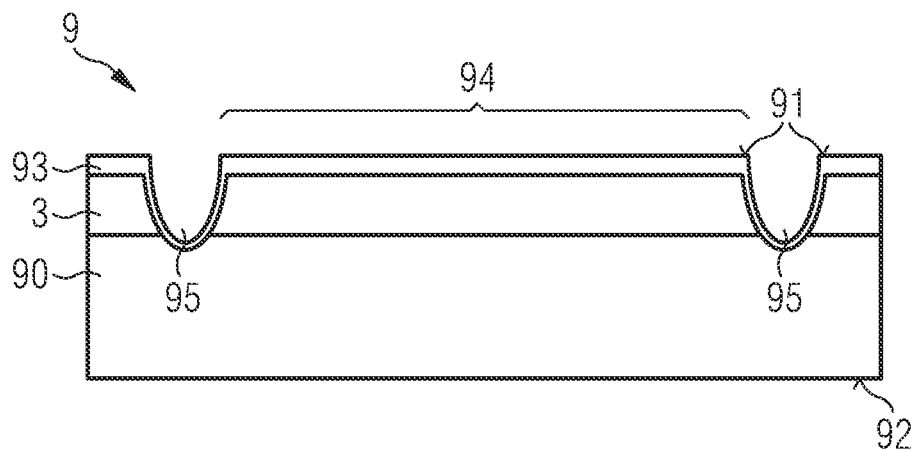

The exemplary embodiment shown in FIG. 2C essentially corresponds to the exemplary embodiment of a carrier 9 shown in FIG. 2B. In contrast, the carrier 9 has at least one opening 95 or a plurality of openings 95. In particular, in lateral directions, the mounting surface 94 or a subsection of the mounting surface 94 is bounded by the opening 95 or by the plurality of openings 95.

The opening 95 or the plurality of openings 95 can extend throughout the buffer layer 3, for instance into the base body 90. The buffer layer 3 is thus structured. In a plan view, the buffer layer 3 can still be covered, in particular completely covered, by the metallization layer 93. The inner walls of the openings 95 can be covered, in particular completely covered, by the metallization layer 93. The metallization layer 93 can still be continuous and free of holes.

For example, the metallization layer 93 is applied to the buffer layer 3 only after the openings 95 have been formed. The buffer layer 3 can be applied in a structured manner onto the base body 90, for example, with the help of a mask. Alternatively, the buffer layer 3 can first be formed as a continuous layer and subsequently structured, for example, by an etching process.

Figure 2D:
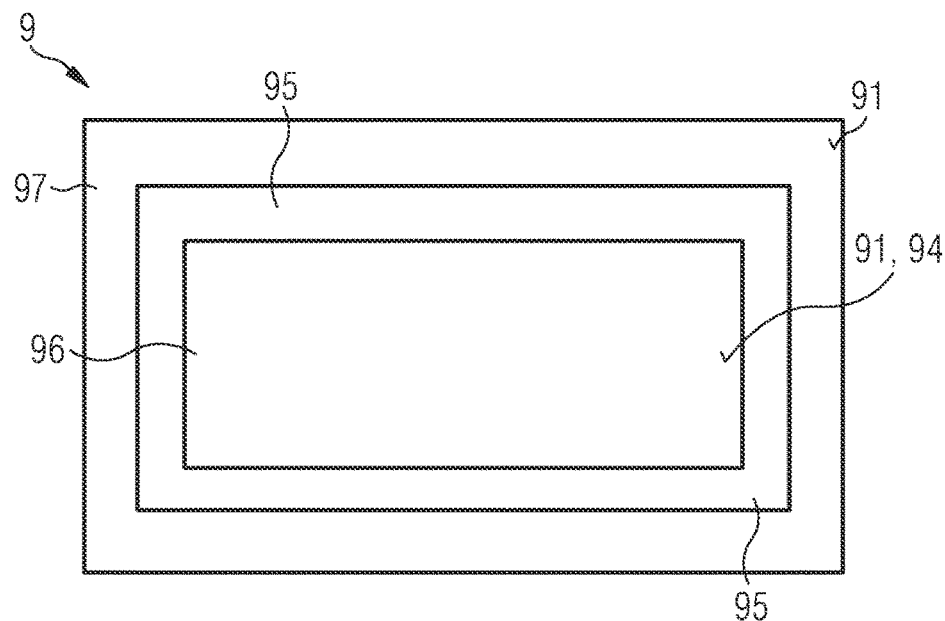

The exemplary embodiment shown in FIG. 2D in particular corresponds to the exemplary embodiment of a carrier 9 shown in a plan view in FIG. 2C. The opening 95 can be in the form of a trench or frame. In particular, a first subsection 96 of the main surface 91 is surrounded, in particular completely surrounded, by the opening 95 in lateral directions. For example, the first subsection 96, which is continuous, forms the mounting surface 94, while a second subsection 97 of the main surface 91 is laterally spaced from the first subsection 96 by the opening 95. It has been found that an interruption of the buffer layer 3 leads to an improved buffering effect. Deviating from FIG. 2D, it is possible that the carrier 9 has a plurality of such laterally spaced subsections 96 or mounting surfaces 94. Further deviating from FIG. 2D, it is possible that the carrier may have electrical conductor tracks and/or electrical terminals on the first main surface for the electrically contacting a component arranged on it.

Figure 2E:
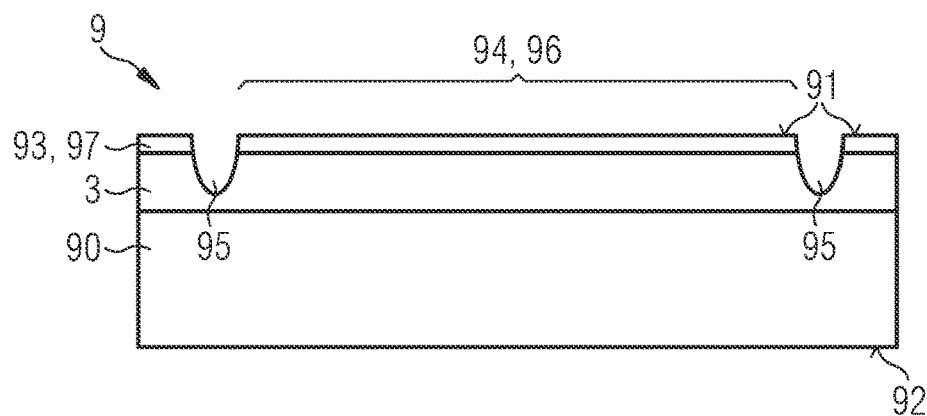

The exemplary embodiment shown in FIG. 2E essentially corresponds to the exemplary embodiment of a carrier 9 shown in FIG. 2C or 2D. In contrast, the opening 95 or the plurality of openings 95 extends throughout the metallization layer 93, in particular into the buffer layer 3.

Figure 2F:
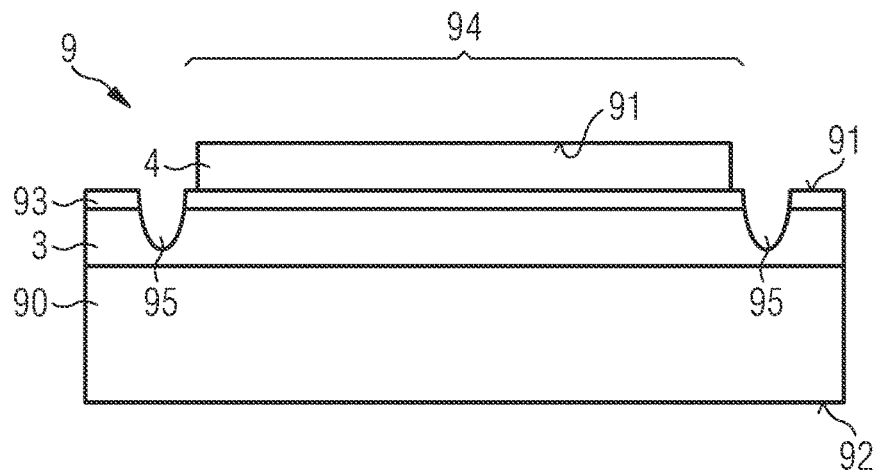

The exemplary embodiment shown in FIG. 2F is essentially the same as the exemplary embodiment of a carrier 9 shown in FIG. 2E. In contrast, the carrier 9 has a connection layer 4. In particular, the mounting surface 94 is at least partially formed by a surface of the connection layer 94. The exemplary embodiments shown in FIGS. 2A to 2E may also have such a connection layer 4.

In FIG. 2F, the mounting surface 94 is a local vertical elevation on the main surface 91, wherein in lateral directions, the mounting surface 94 is bounded in particular by the opening 95 or by the plurality of openings 95. The connection layer 4 may have a connecting material, such as solder. The opening 95 or the plurality of openings 95 can serve as a creep stop for liquid bonding material and is in particular configured to collect melted or excess bonding material, for example, during the mounting of one or a plurality of semiconductor chips.

In all the exemplary embodiments, the buffer layer 3 may have a material composition which in particular differs from a material composition of the carrier 9 and/or of the substrate 1. The buffer layer 3 is preferably metallic and has a yield stress between 10 MPa and 300 MPa inclusive. The buffer layer 3 is preferably a ductile metal such as Au, Al or Cu or their alloys or consists of one or several of these materials. To reduce the yield stress, the buffer layer 3 can be coarse-grained, for example, with metal grains larger than 100 nm.

In particular, buffer layer 3 is different from the connection layer 4, for example, different from a solder layer.

FIGS. 3A, 3B, 3C and 3D show schematic exemplary embodiments of components 100 comprising a semiconductor chip 10 on a carrier 9 having a base body 90. A connection layer 4, a buffer layer 3 and a metallization layer 93 are arranged between the semiconductor chip and the base body 90. However, the metallization layer 93 can be optional. In particular, the connection layer 4 adjoins both the mounting surface 94 and a rear side 102 of the semiconductor chip 10, for example, the substrate 1.

Figure 3A:
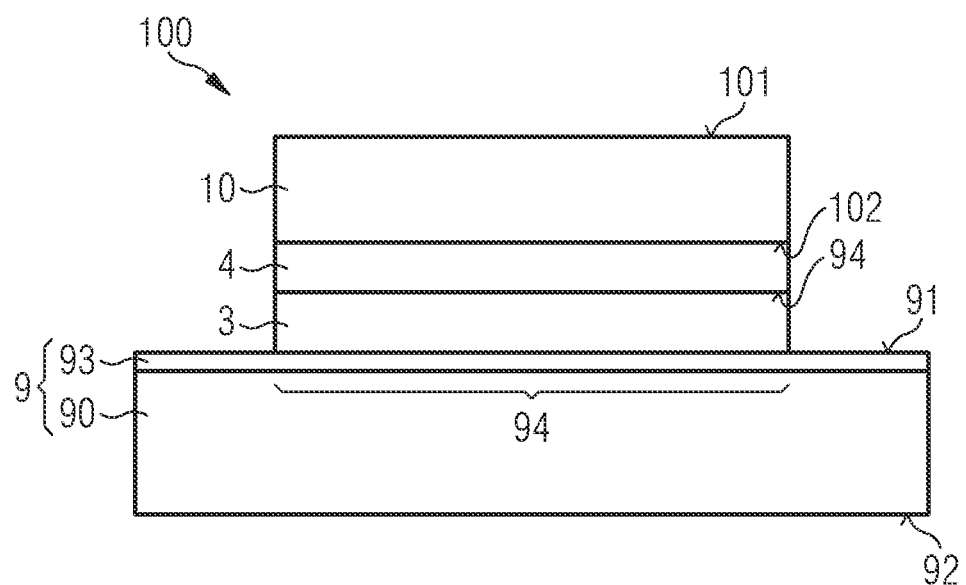
FIGS. 3A, 3B, 3C, 3D, 4A, 4B and 4C show schematic diagrams of various exemplary embodiments of a component having a buffer layer, each in sectional view.

The exemplary embodiment of a component 100 shown in FIG. 3A corresponds to the exemplary embodiment of a carrier 9 together with a semiconductor chip 10 placed thereon shown in FIG. 2A. In particular, the buffer layer 3 is formed as a socket underneath the semiconductor chip 10. In a plan view of the carrier 9, it is possible that the semiconductor chip 10 completely covers the buffer layer 3. In this case, the buffer layer 3 is formed exclusively within an area covered by the semiconductor chip 10. Alternatively, it is possible that the buffer layer 3, which is formed as a socket, protrudes laterally along a lateral direction beyond the semiconductor chip 10. In particular, the buffer layer 3 only partially covers the first main surface 91, the metallization layer 93 and/or the base body 90.

Figure 3B:
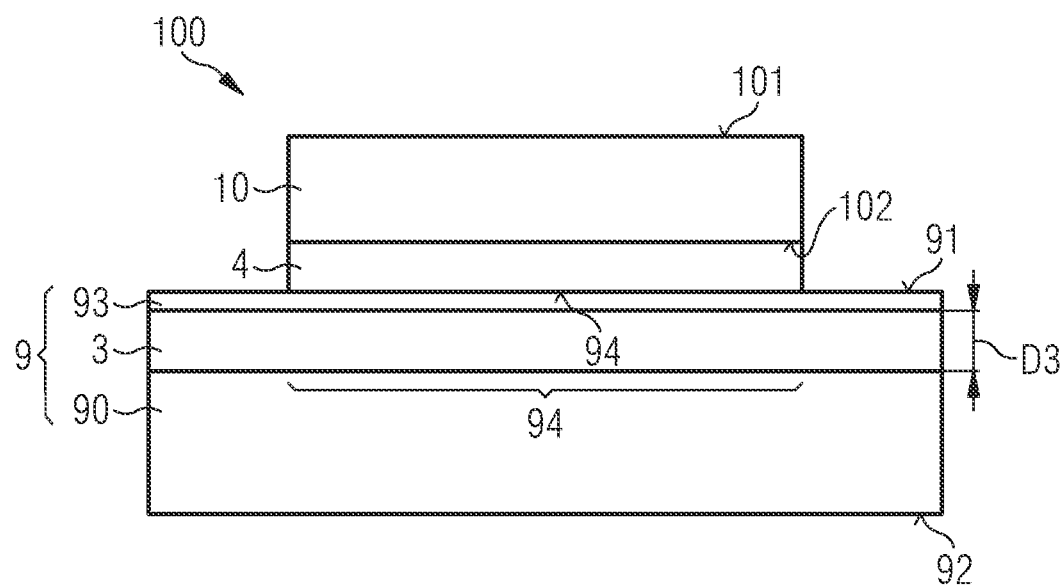
Figure 3C:
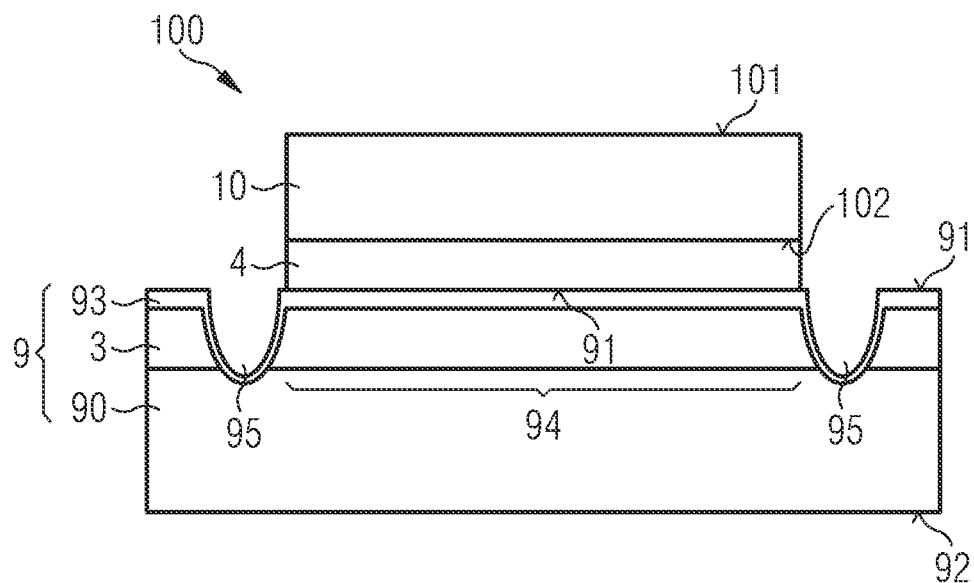
Figure 3D:
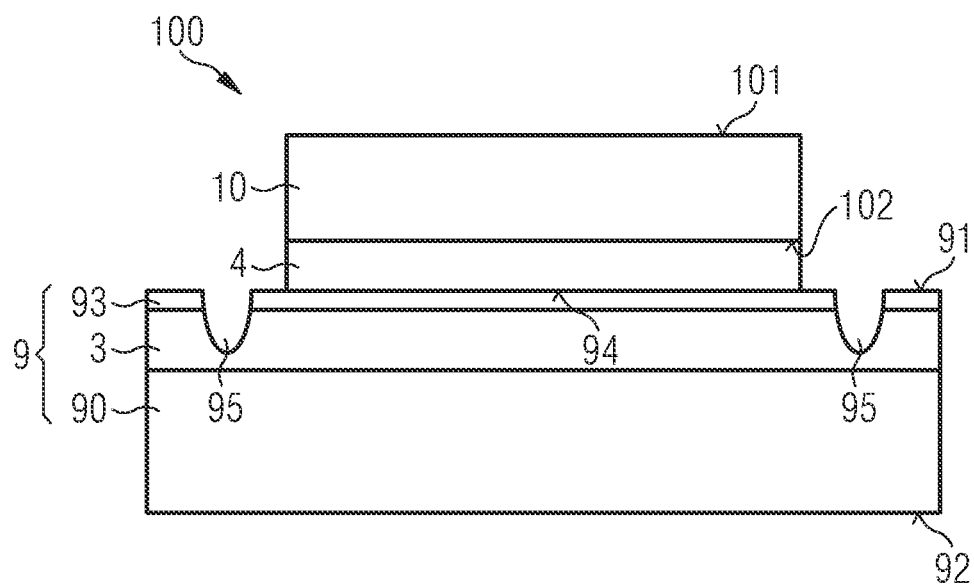

The exemplary embodiments of various components 100 shown in FIGS. 3B, 3C and 3D correspond to the exemplary embodiments of a carrier 9 shown in FIGS. 2B, 2C and 2E, respectively, together with a semiconductor chip 10 arranged thereon. The buffer layer 3 may project laterally beyond the semiconductor chip 10 and may partially or completely cover the first main surface 91, the metallization layer 93 and/or the base body 90.

The exemplary embodiment shown in FIG. 4A essentially corresponds to the exemplary embodiment of a component 100 shown in FIG. 3A. In contrast, in FIG. 4A, the semiconductor chip 10 is shown in more detail.

The semiconductor body 2 has a first semiconductor layer 21 facing away from the substrate 1, a second semiconductor layer 22 facing towards the substrate 1 and an optically active zone 23 located between the first and second semiconductor layers. The semiconductor body 2 is based in particular on a III-V or on a II-VI semiconductor compound material. The first semiconductor layer 21 and the second semiconductor layer 22 may be n- or p-type and/or n- or p-doped, or vice versa.

The semiconductor body 2 has a first main surface 201 facing away from substrate 1 and a second main surface 202 facing towards substrate 1. The first main surface 201 and the second main surface 202 each delimit the semiconductor body 2 in the vertical direction. The converter layer 6 is attached to the first main surface 201 of the semiconductor body 2 by the further connection layer 5. A particularly exposed surface of the converter layer 6 forms the front side 101 of the semiconductor chip 10 and/or of the component 100.

The semiconductor chip 10 has a first contact layer 71 for making electrical contact with the first semiconductor layer 21 and a second contact layer 72 for making electrical contact with the second semiconductor layer 22. In FIG. 4A, the first contact layer 71 is located on the side of the first main surface 201 and the second contact layer 72 is located on the side of the second main surface 202 of the semiconductor body 2. In particular, the second contact layer 72 is located in certain areas between the semiconductor body 2 and the substrate 1. The semiconductor chip 10 can be externally electrically contacted via the contact layers 71 and 72, which are at least partially accessible via the front side 101 of the component 100.

The carrier 9 can have conductor tracks (not shown in the figures), which are arranged for instance on the mounting surface 94 and/or laterally to the mounting surface 94 on the main surface 91 of the carrier 9. For example, the contact layers 71 and 72 can be electrically connected to the conductor tracks of the carrier 9 via bonding wires. It is possible that the carrier 9 has metallic lead frames. In particular, the base body 90 forms the lead frames which are enclosed for instance by a mold body. The mold body can be formed to be electrically insulating.

The exemplary embodiment shown in FIG. 4B essentially corresponds to the exemplary embodiment for a component 100 shown in FIG. 4A. In contrast to this, the second contact layer 72, which is formed in the form of a through-contact, extends from the second main surface 202 for instance throughout the substrate 1 as far as the rear side 102 of the semiconductor chip 10, for example. In particular, the buffer layer 3 and the connection layer 4 are formed to be electrically conductive. The semiconductor chip 10 can be in electrical contact with the carrier 1 and can be electrically contacted via carrier 1.

Deviating from FIG. 4B, it is possible that the substrate 1 is formed to be electrically conductive. In this case, the second contact layer 72, which is formed as a through-contact, can be dispensed with.

The exemplary embodiment shown in FIG. 4C essentially corresponds to the exemplary embodiment of a component 100 shown in FIG. 4B. In contrast to this, the semiconductor chip 10 has a through-via 70 which extends for instance from the second main surface 202 or from the first contact layer 71 throughout the second semiconductor layer 22 and the active zone 23 into the first semiconductor layer 21. For lateral electrical insulation, the through-via 70 is completely enclosed by an insulating layer 8 in lateral directions.

As shown in FIG. 4C, both the first contact layer 71 and the second contact layer 72 are located in places on the second main surface 202. The first contact layer 71 is arranged at least in places between the substrate 1 and the semiconductor body 2. Deviating from FIG. 4C, it is possible that both the first contact layer 71 and the second contact layer 72 extend throughout the substrate 1. In such cases, the semiconductor chip 10 is a surface-mountable semiconductor chip which is electrically contactable only at its rear side 102.

FIGS. 5A, 5B, 5C and 5D show the results of some experimental measurements (FIG. 5A) and some simulations (FIGS. 5B, 5C and 5D) for a component 100. The terms K, N and S stand for the bending of the semiconductor chip 10, the maximum normal stress determined on the semiconductor chip 10 and the maximum shear stress determined on the semiconductor chip at room temperature after the bonding process, respectively. The parameters O3, M3, T1 and T2 mean, in the order given, "without buffer layer 3", "with buffer layer 3", "before tempering" and "after tempering", respectively.

A component 100, for instance according to FIG. 1B or 3A, comprising a semiconductor chip 10 and a carrier 9 is used as a sample, wherein the carrier 9 comprises copper lead frames and the semiconductor chip 10 comprises a silicon substrate 1 and is attached to the carrier 9 by a solder layer 4. The carrier 9 or the base body 90 of the carrier 9 has a layer thickness of for instance 150 µm. The buffer layer 3 is made of gold and has a layer thickness D2 of about 2 µm.

Figure 5A:
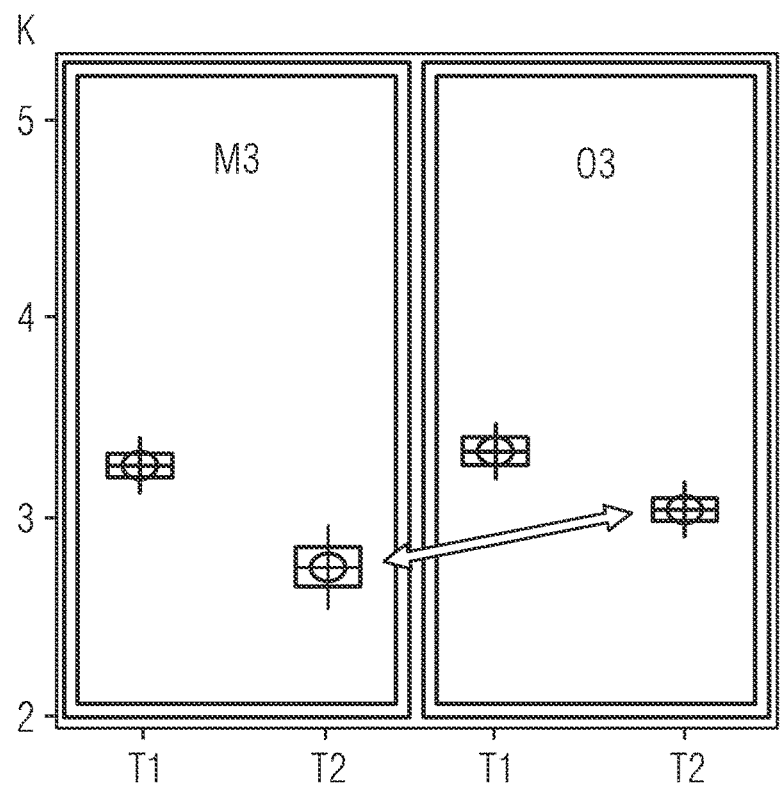
Figure 5B:
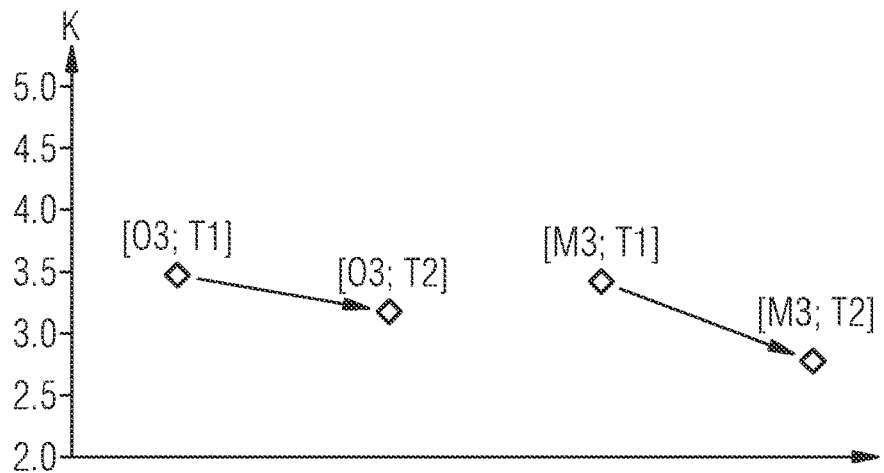

FIG. 5A shows that the use of the buffer layer 3 reduces the bending K. The bending K of the semiconductor chip 10 and/or of the component 100 can also be reduced by a tempering process, as a result of which the bending K can be reduced significantly in the presence of the buffer layer 3. This effect regarding the reduction of the bending K can also be seen in FIG. 5B. According to the results shown in FIGS. 5A and 5B, the semiconductor chip 10 has the smallest bending K when the component 100 has a buffer layer 3 and the component 100 is tempered, especially after the semiconductor chip 10 has been attached to the carrier 9.

Figure 5C:
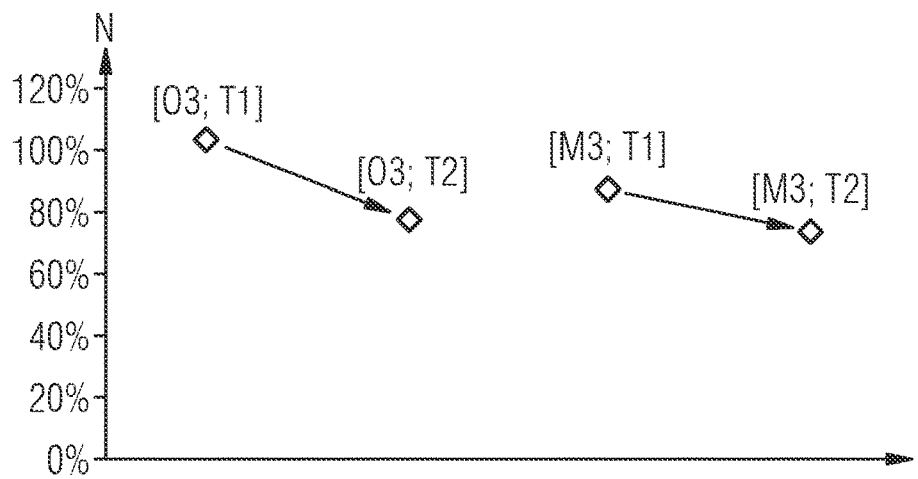
Figure 5D:
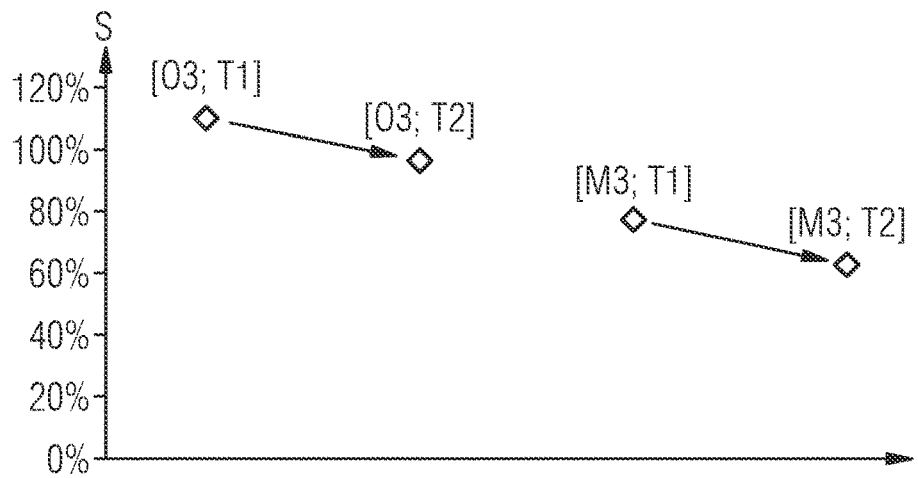

In comparison to the bending K, analogous results for the normalized normal stress N and the shear stress S are shown in FIGS. 5C and 5D. The maximum normal stress N and the maximum shear stress S for a component without buffer layer 3 are normalized to 1 at time T1. It has been shown that the component 100 is most stable if the component 100 has a buffer layer 3 and is heat treated. The maximum normal stress N or the maximum shear stress S can be reduced by more than 20% or by more than 40%.

It has also been found that the maximum normal stress N decreases with increasing layer thickness of the buffer layer 3. For layer thicknesses of 0.5 µm, 1 µm and 2 µm, a maximum normal stress of 127 MPa, 125 MPa and 124 MPa is determined in the given sequence.

It is also noted that, compared to a component 100 according to FIG. 1B, the bending K, the normal stress N and the shear stress S can be reduced more significantly for a component 100 according to FIGS. 3A, 3B, 3C and 3D. The reason for this is that in comparison to the component according to FIG. 1B, the buffer layer 3 is not only located directly below the semiconductor chip 10 but can also protrude laterally beyond the edge of the semiconductor chip. In this case, a larger portion of the first main surface 91 of the carrier 9 or the entire first main surface 91 can be covered by the buffer layer 3, which better compensates for any internal thermo-mechanical distortion that occurs.

The simulations have also shown that the buffering effect is additionally increased if the buffer layer 3 is not continuous but—as shown in FIGS. 2C, 2D, 2E, 2F, 3C and 3D—structured. In this case, the opening 95 or the plurality of openings 95 can act as compensation zones that prevent severe deformation or bending of the carrier 1.

FIGS. 6A and 6B show some further results for the determined normal stress N and the determined bending K at time T1 before thermal treatment or at time T2 after thermal treatment. Here, components 100 having different designs, namely according to FIG. 1A, 3B or 3C and partly with different layer thicknesses D3 of the buffer layer 3 are investigated. It was found that the buffer effect of the buffer layer 3 increases with increasing layer thickness D3. A lateral structuring of the buffer layer 3 (FIG. 3C) can further increase the buffering effect. In addition, a thermal treatment results in a significant reduction in the bending or curvature K of the semiconductor chip 10 and the maximum normal stress N determined at the semiconductor chip 10.

The exemplary embodiment shown in FIG. 7A essentially corresponds to the exemplary embodiment of a component 100 shown in FIG. 4C. In contrast, the semiconductor body 2 is located between the substrate 1 and the carrier 9 or the buffer layer 3. The substrate 1 is located between the semiconductor body 2 and the converter layer 6. In particular, the semiconductor chip 10 is a flip chip. The substrate 1 can be formed to be transparent to radiation.

In further contrast to the component 100 shown in FIG. 4C, the buffer layer 3 and/or the connection layer 4 have/has subsections that are laterally spaced by an intermediate region 80. The intermediate region 80 can be filled with an electrically insulating material. A first subsection 41 of the connection layer 4 is electrically connected for instance to the first contact layer 71. A second subsection 42 of the connection layer 4 is electrically connected for instance to the second contact layer 72. A first subsection 31 of the buffer layer 3 is laterally spaced from the second subsection 32 of the buffer layer 3 by the intermediate region 80 and is in particular electrically insulated from the latter. The intermediate region 80 extends along the vertical direction in particular throughout the buffer layer 3 and/or throughout the connection layer 4.

Via the first subsections 31 and 41, the first contact layer 71 can be electrically connected, for example, to a first terminal area or to a first conductor track on the carrier 9 (not shown in FIG. 7A). Via the second subsections 32 and 42, the second contact layer 72 can be electrically connected to, for example, a second pad or a second conductor track on the carrier 9 (not shown in FIG. 7A).

In deviation from FIG. 7A, it is possible for the contact layers 71 and 72 to extend throughout the buffer layer 3 and to be electrically insulated from the buffer layer 3 by an insulating layer, for example. In this case, the buffer layer 3 may still be continuous. It is also possible that the intermediate region 80 extends throughout the carrier 9 and separates the carrier 9 into two laterally spaced subsections.

The exemplary embodiment shown in FIG. 7B essentially corresponds to the exemplary embodiment of a component 100 shown in FIG. 4C. In contrast to this, both the first contact layer 71 and the second contact layer 72 are formed as through-contacts throughout the substrate 1. The electrical contact between the semiconductor chip 10 and the carrier 9 shown in FIG. 7B corresponds to the contact shown in FIG. 7A.

Using a buffer layer, in particular a ductile material, which is arranged between a metallic carrier and a semiconductor chip attached to the carrier, a component comprising the carrier and the semiconductor chip can be made particularly mechanically stable. With regard to its mechanical stability and/or chromaticity diagram stability, such a component is also particularly insensitive to severe temperature fluctuations.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

The invention claimed is:

1. A component comprising:
a semiconductor chip comprising a substrate and a semiconductor body arranged thereon; and
a metallic carrier having a coefficient of thermal expansion which is at least 1.5 times greater than a coefficient of thermal expansion of the substrate or of the semiconductor chip,
wherein the semiconductor chip is attached to a mounting surface of the metallic carrier by a connection layer such that the connection layer is located between the semiconductor chip and a buffer layer and adjoins a rear side of the semiconductor chip,
wherein the buffer layer has a yield stress which is at least 10 MPa and at most 300 MPa,
wherein the substrate of the semiconductor chip and the metallic carrier of the component have a higher yield stress than the buffer layer, the substrate being a growth substrate on which the semiconductor body is epitaxially grown or the substrate comprising a metallic through-contact and a base body made of a semiconductor material or an electrically insulating material and the through-contact extending throughout the base body, and
wherein the buffer layer is structured such that it has an opening extending along a vertical direction into the buffer layer or throughout the buffer layer into the base body and is arranged laterally to the mounting surface, or
wherein the buffer layer has a vertical layer thickness between 250 nm and 10 μm inclusive and the base body or the entire metallic carrier has a vertical layer thickness of at least 50 μm.

2. The component according to claim 1, wherein, in a plan view of the metallic carrier, the buffer layer is partially covered by the semiconductor chip and projects laterally beyond the semiconductor chip in places.

3. The component according to claim 1, wherein the buffer layer is formed coarsely with an average grain size greater than wo nm.

4. The component according to claim 1, wherein the buffer layer is a ductile metallic layer or a ductile metal layer.

5. The component according to claim 1,
wherein the metallic carrier comprises at least one material from the group consisting of Ag, Al, Au, Cu, Mg, Mn, Ni, Pb, Pt, Sn, Mo, W and Zn, and
wherein the buffer layer comprises at least one metal, wherein, with respect to its material selection and with regard to the metallic carrier and/or the substrate, the buffer layer comprises a lower yield stress than the metallic carrier and/or the substrate.

6. The component according to claim 1, wherein the connection layer is a solder layer.

7. The component according to claim 1, wherein the metallic carrier is a printed circuit board which is configured for mounting and for electrical contacting of one or a plurality of semiconductor chips.

8. The component according to claim 1, wherein the metallic carrier has a metallization layer which adjoins the buffer layer.

9. The component according to claim 8, wherein the metallization layer is an electroplated metal layer.

10. The component according to claim 1, further comprising a converter layer arranged on a surface of the semiconductor chip facing away from the metallic carrier, wherein the semiconductor chip is a light-emitting diode and the converter layer comprises wavelength-converting phosphors.

11. The component according to claim 10, wherein the substrate and/or the metallic carrier have/has a vertical layer thickness of less than 400 µm, and wherein the converter layer is a prefabricated converter platelet attached to the semiconductor chip via a further connection layer.

12. A method for producing the component according to claim 1, the method comprising:
tempering the component after the semiconductor chip has been mounted on the metallic carrier.

13. The method according to the claim 12, wherein tempering the component comprises tempering the component at a temperature between 125° C. and 200° C. inclusive, and wherein the connection layer is an AuSn-based solder layer.

14. A carrier comprising:
a buffer layer and a base body,
wherein the carrier has a mounting surface configured to receive a semiconductor chip,
wherein the buffer layer is located between the mounting surface and the base body,
wherein the buffer layer has a yield stress which is at least 10 MPa and at most 300 MPa,
wherein the carrier is a metallic carrier,
wherein with respect to a material composition, the base body and the buffer layer are formed such that a yield stress of the base body is greater than the yield stress of the buffer layer, and
wherein the buffer layer is structured such that it has an opening which extends along a vertical direction into the buffer layer or throughout the buffer layer into the base body and is arranged laterally to the mounting surface.

15. The carrier according to claim 14, wherein the opening serves as a creep stop for liquid bonding material.

16. The carrier according to claim 14, further comprising a connection layer arranged on the mounting surface, wherein the connection layer is a solder layer.

17. A component comprising:
a semiconductor chip comprising a substrate and a semiconductor body arranged thereon; and
a metallic carrier having a coefficient of thermal expansion which is at least 1.5 times greater than a coefficient of thermal expansion of the substrate or of the semiconductor chip,
wherein the semiconductor chip is attached to a mounting surface of the metallic carrier by a connection layer such that the connection layer is located between the semiconductor chip and a buffer layer and adjoins a rear side of the semiconductor chip,
wherein the buffer layer has a yield stress which is at least 10 MPa and at most 300 MPa,
wherein the substrate of the semiconductor chip and the metallic carrier of the component have a higher yield stress than the buffer layer, the substrate being a growth substrate on which the semiconductor body is epitaxially grown or the substrate comprising a metallic through-contact and a base body made of a semiconductor material or an electrically insulating material and the through-contact extending throughout the base body, and
wherein the buffer layer is structured such that it has an opening, the opening being a trench or of a frame which partially or completely surrounds the mounting surface laterally so that the mounting surface is formed as a local vertical elevation on a main surface of the metallic carrier and is bounded in lateral directions by the opening, or
wherein the buffer layer is a continuous buffer layer, the buffer layer completely covering the base body of the metallic carrier in a plan view of the metallic carrier.

18. The component according to claim 17, wherein the buffer layer is structured such that it has the opening, wherein the opening is the trench or of the frame which partially or completely surrounds the mounting surface laterally so that the mounting surface is formed as the local vertical elevation on the main surface of the metallic carrier and is bounded in the lateral directions by the opening.

19. The component according to claim 17, wherein the buffer layer is the continuous buffer layer, and wherein the buffer layer completely covers the base body of the metallic carrier in the plan view of the metallic carrier.

* * * * *

UNITED STATES PATENT AND TRADEMARK OFFICE
CERTIFICATE OF CORRECTION

| | |
|---|---|
| PATENT NO. | : 11,450,794 B2 |
| APPLICATION NO. | : 16/639722 |
| DATED | : September 20, 2022 |
| INVENTOR(S) | : Paola Altieri-Weimar |

It is certified that error appears in the above-identified patent and that said Letters Patent is hereby corrected as shown below:

In the Claims

Claim 3, Column 16, Line 49; delete "wo" and insert --100--.

Signed and Sealed this
First Day of November, 2022

*Katherine Kelly Vidal*

Katherine Kelly Vidal
*Director of the United States Patent and Trademark Office*